US010187107B1

(12) United States Patent
Bulja et al.

(10) Patent No.: US 10,187,107 B1
(45) Date of Patent: Jan. 22, 2019

(54) ELECTROCHROMIC SWITCH

(71) Applicant: NOKIA SOLUTIONS AND NETWORKS OY, Espoo (FI)

(72) Inventors: Senad Bulja, Dublin (IE); Rose Kopf, Greenbrook, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/959,564

(22) Filed: Apr. 23, 2018

(51) Int. Cl.
*H04B 7/02* (2018.01)
*H01P 1/10* (2006.01)
*H01P 1/18* (2006.01)
*H04B 1/40* (2015.01)
*H04B 1/44* (2006.01)
*G02F 1/161* (2006.01)
*G02F 1/15* (2006.01)
*G02F 1/163* (2006.01)

(52) U.S. Cl.
CPC ............. *H04B 1/44* (2013.01); *G02F 1/1523* (2013.01); *G02F 1/161* (2013.01); *G02F 1/163* (2013.01); *G02F 2203/02* (2013.01); *G02F 2203/48* (2013.01)

(58) Field of Classification Search
CPC ... G02F 1/163; H01P 1/10; H01P 1/18; H01P 1/20; H04B 1/00; H04B 1/40; H04B 7/02
See application file for complete search history.

(56) References Cited

U.S. PATENT DOCUMENTS

| | | | | |
|---|---|---|---|---|
| 4,245,883 | A * | 1/1981 | Johnson | ..................... G02F 1/31 385/17 |
| 2015/0323576 | A1* | 11/2015 | Bulja | ..................... G01R 27/06 324/638 |
| 2015/0325897 | A1* | 11/2015 | Bulja | ..................... G02F 1/163 333/238 |
| 2016/0154290 | A1* | 6/2016 | Brown | ................ H04L 12/4625 359/275 |

OTHER PUBLICATIONS

Bulja, S. et al; High Frequency Dielectric Characteristics of Electrochromic, WO 3 and NiO Films with LiNbO 3 Electrolyte; Scientific Reports; 6:28839; DOI:10.1038/srep28839; pp. 1-8; 2016.
Bulja, S. et al; Tuneable Dielectric and Optical Characteristics of Tailor-made inorganic electro-chromic materials; Scientific Reports; 7:13484; DOI:10.1038/s41598-017-13941-9; pp. 1-8; 2017.

* cited by examiner

*Primary Examiner* — Blane Jackson
(74) *Attorney, Agent, or Firm* — Patti & Malvone Law Group, LLC

(57) ABSTRACT

An electrochromic (EC) switch is disclosed and claimed. The EC switch includes an EC region and an electrolyte region separated by a dielectric region on a ground plane. A microstrip configured to transmit an RF signal is adjacent to and in electrical contact with the EC region. A conductive pad is adjacent to the electrolyte region and a bias line couples the microstrip to the electrolyte region. Voltages applied between the ground plane and the conductive pad and between the conductive pad and the bias line switch the microstrip. The EC switch may be incorporated within a wide variety of RF devices, for example, attenuators, phase shifters and antennas.

16 Claims, 3 Drawing Sheets

ELECTROCHROMIC SWITCH

TECHNICAL FIELD

Various example embodiments relate generally to radio frequency (RF) circuitry and more particularly to an RF switch.

BACKGROUND

Radio frequency (RF) switches are used in many applications for switching signals in a variety of frequency bands. One of the purposes of an RF switch, for example, is to turn a particular signal path ON or OFF. Applications using RF switches include, for example, communications systems, waveguide switches and testing systems.

Electrochromic materials are materials that allow their optical and/or electrical properties to be controlled by applying a voltage.

SUMMARY

Example embodiments encompass a switch including an electrochromic region conductively coupled to a means for transmitting a signal; a voltage-controlled means for providing ions conductively coupled to the means for transmitting a signal; and a means for separating the electrochromic region from the means for providing ions.

A further embodiment encompasses a switch including a ground plane layer; an electrochromic region adjacent to the ground plane layer; means for providing ions to the electrochromic region adjacent to the ground plane layer; means for applying a voltage adjacent to the means for providing ions; means for separating the electrochromic region and the means for providing ions; means for transmitting a signal adjacent to the electrochromic region; means for coupling the means for transmitting a signal to the means for providing ions; wherein the switch is controlled by a first voltage between the ground plane layer and the means for applying a voltage, and a second voltage between the means for applying a voltage and the means for coupling the means for transmitting a signal to the means for providing ions.

In either of the above embodiments, the electrochromic region includes a first chromic layer and a second chromic layer.

In a further embodiment, the electrochromic region includes a conductive layer between the first and second chromic layers.

In any of the above embodiments, the first and second chromic layers are transition metal oxides, for example, the first chromic layer may be tungsten oxide (WO3) and the second chromic layer may be nickel oxide (NiO).

In any of the above embodiments, the means for providing ions may be lithium niobate (LiNbO3).

In any of the above embodiments, the switch includes a voltage inactive substrate between the means for coupling and at least a portion of the electrochromic region, and the voltage inactive substrate and the means for separating may be, for example, silicon dioxide (SiO2).

In a further embodiment, the first and second voltages are less than approximately 10 V.

Another embodiment encompasses a radio frequency (RF) device comprising at least one of any of the above switch embodiments.

In further embodiments, the RF encompasses, for example, a phase shifter, an antenna array, or an attenuator.

DESCRIPTION OF THE DRAWINGS

Some example embodiments will now be described with reference to the accompanying drawings in which.

DETAILED DESCRIPTION

Electrochromic materials exhibit a reversible change in optical and/or electrical properties in the presence of a voltage. An example of an electrochromic cell includes one or more electrochromic (EC) layers and an ion-containing electrolyte layer sandwiched between conducting layers. In a non-actuated state, the one or more EC layers are non-conductive and behave as insulators. The electrolyte layer is non-conductive in both actuated and non-actuated states. Upon application of a DC bias voltage between the conducting layers, ions from the electrolyte layer are expelled and subsequently injected into the one or more EC layers through a process of intercalation, which changes the fundamental characteristics of the EC layers. For certain combinations of EC and electrolyte materials, the EC layers become electrically conductive when a DC bias voltage is applied.

Figure 1:
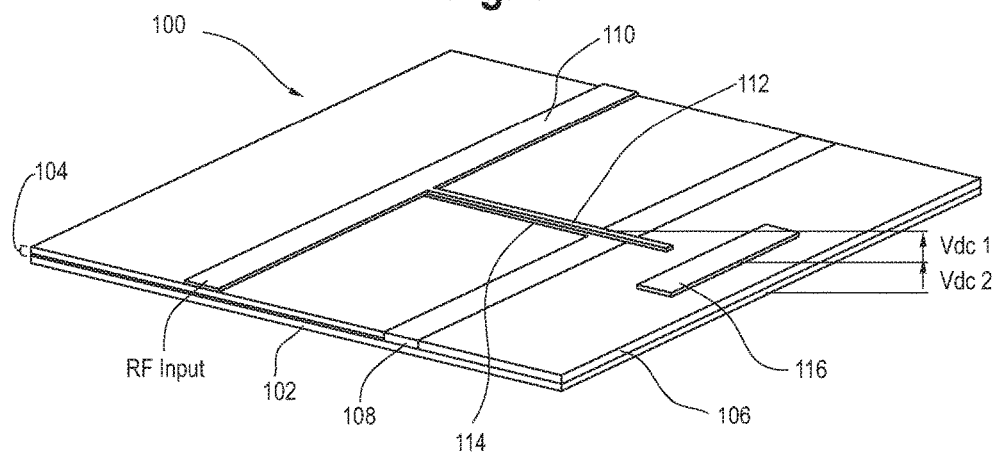
FIG. 1 shows a perspective view of an electrochromic (EC) switch.

FIG. 1 illustrates an embodiment of an electrochromic (EC) switch 100 for use in RF applications. Ground plane layer 102 acts as a substrate for EC switch 100. Ground plane layer 102 is formed of a conductive material, for example, gold, indium tin oxide (ITO), zinc oxide (ZnO) or a conductive polymer. Two main regions are formed on ground plane layer 102. A first is EC region 104 which includes at least two layers as explained in more detail in connection with FIG. 2. A second is electrolyte region 106. Electrolyte region 106 serves as a tank of available ions to be injected into EC region 104. In an embodiment, electrolyte region 106 is formed from lithium niobate (LiNbO$_3$) but any electrolyte meeting the requirement of displaying different ion and electron conductivities, approximately $\sigma_I > 10^{-7}$ S/cm for ions and $\sigma_E < 10^{-10}$ S/cm (siemens per centimeter) for electrons may be used. EC region 104 and electrolyte region 106 are separated by a dielectric spacer 108. In an embodiment, dielectric spacer 108 is silicon dioxide (SiO$_2$) but any DC bias voltage inactive material may be used.

Microstrip line 110 transmits RF signals from one side of switch 100 to the other and is mounted on EC region 104. Although FIG. 1 shows microstrip line 110 as having an RF Input and an RF Output for the purposes of illustration, either end may be used for input or output as needed. DC bias line 112 connects microstrip line 110 to electrolyte region 106. In an embodiment, DC bias line 112 may be mounted on an DC bias voltage inactive substrate 114 similar to or the same as dielectric spacer 108, so as to avoid diffusion of Li ions from DC bias line 112 into EC region 104 before they reach microstrip line 110. Conductive pad 116 is formed on electrolyte region 106. In an embodiment, microstrip line 110, DC bias line 112 and conductive pad 116 are formed from a conductive material, for example, gold, silver, copper, or indium tin oxide (ITO).

Figure 2:
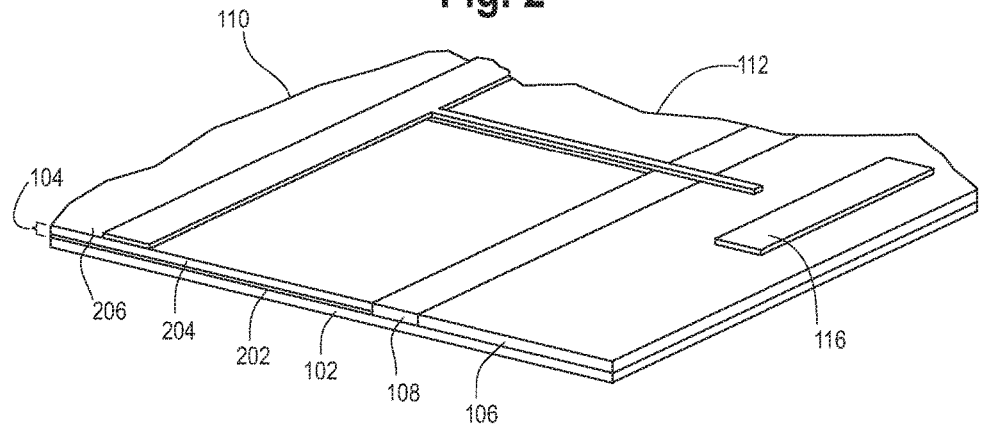
FIG. 2 shows a magnified view of a portion of the EC switch of FIG. 1.

A magnified view of a portion of FIG. 1 is shown in FIG. 2. Like reference numerals designate like parts in both figures. In an embodiment, EC region 104 is shown to include three layers, a first chromic layer 202, an optional conductive layer 204 and a second chromic layer 206. In an example embodiment, chromic layers 202 and 206 are transition metal oxides, for example, tungsten oxide ($WO_3$) and nickel oxide (NiO) respectively. In other representative embodiments, chromic layer 202 may be formed from, for example, titanium oxide ($TiO_2$), molybdenum trioxide ($MoO_3$), tantalum oxide ($Ta_2O_5$) or niobium pentoxide ($Nb_2O_5$) while chromic layer 206 may be formed from, for example, chromium oxide ($Cr_2O_3$), manganese oxide ($MnO_2$), iron oxide ($FeO_2$), cobalt oxide ($CoO_2$), rhodium oxide ($RhO_2$) or iridium oxide ($IrO_2$). Conductive layer 204 is optional and is used to adjust operational characteristics of switch 100 as will be explained in more detail below. It may be formed from, for example, indium tin oxide, although almost any conductive material may be used.

In operation, an RF signal enters microstrip line 110 on one side of switch 100 and exits on the other side as shown in FIG. 1. In the absence of any DC bias voltage, microstrip line 110 behaves as a simple transmission line.

Two DC bias voltages as shown in FIG. 1 may be used in the operation of EC switch 100. A first bias voltage $V_{dc1}$ is applied between conductive pad 116 and ground plane 102 in order to set Li ions in electrolyte region 106 in motion. For the purposes of describing the invention, electrolyte region 106 will be described as lithium niobate ($LiNbO_3$) with Li ions but one of ordinary skill in the art would understand that the description is applicable to any electrolyte meeting the conditions described above. The value of $V_{dc1}$ depends on the thickness of the electrolyte layer 106 but is generally less than 10 V.

Once in motion, these ions, upon application of a second bias voltage $V_{dc2}$ between conductive pad 116 and DC bias line 112, move through DC bias line 112 into RF microstrip line 110, where they are injected into chromic layers 202 and 206 (FIG. 2). In an embodiment, $V_{dc2}$ is generally less than 10 V. The application of $V_{dc2}$ causes intercalation of Li ions into chromic layers 202 and 206 so that they become conductive, which short-circuits microstrip line 110 with ground plane layer 102 through conductor 204, if present. Short circuiting microstrip line 110 prevents transmission of an RF signal along microstrip line 110. Reversing the polarity of the DC bias voltages results in deintercalation. In other words, Li atoms move out of chromic layers 202 and 206, through DC bias line 112 and back to electrolyte region 106 so that microstrip line 110 again behaves as a transmission line. As shown in FIGS. 1 and 2, bias line 112 is a single line. In alternative embodiments, bias line 112 may take other forms, for example, a line loaded with capacitors or an RF choke, for example.

An EC switch as described above has several technical advantages including tailoring of the switching characteristics for different applications. For example, switching speed may be increased by either adjusting the thickness of the chromic layers or by increasing the size of the conductive pad exposed to electrolyte region.

In an embodiment, the thicknesses of chromic layers 202 and 206 of EC region 104 are approximately 50-500 nm, however, the thickness of these layers can be varied to suit particular switching applications and device size requirements. The thickness of optional conductive layer 204, as is the case of the chromic layers, may also be varied to suit particular switching applications and device size requirements. In an embodiment, conductive layer 204 is less than 5 microns thick. In some embodiments, such as when it is desirable to decrease the overall thickness of EC region 104, conductive layer 204 may be eliminated. Alternatively, the overall thickness of EC region 104 be varied by increasing the thickness of conductive layer 204, so that, for example, it is compatible with the rest of any external circuitry. In alternative embodiments, for example, where device switching speed is less important, the overall thickness of EC region 104 can be increased by increasing the thickness of chromic layers 202 and 206 instead.

The thickness of chromic layers 202 and 206 depends on desired operating characteristics. Chromic layers 202 and 206 change their character upon the intercalation of ions when a DC bias voltage is applied and therefore, the thicker these layers are, the greater number of ions needed to initiate their transition from dielectrics to conductors. This in turn may require a larger source of ions in the form of the electrolyte region 106 which increases the size of the device and possibly impacts its speed.

Additional performance characteristics of the EC switch may be tuned by adjusting the thickness of chromic layer 202. In an embodiment, chromic layer 202 is formed of tungsten oxide ($WO_3$) which, when intercalated upon application of a DC bias voltage, is a relatively poor conductor, having a typical resistivity value of about $3 \times 10^{-3}$ ($\Omega \cdot cm$). In some embodiments, using a thin $WO_3$ layer, for example, less than 100 nm, for chromic layer 202 together with a conductive layer 204 may be advantageous, since the conduction is vertical with respect to ground plane 102. In that case, the lower conductivity of chromic layer 202 does not have a deleterious effect on the performance of the entire layered structure.

Chromic layer 206 may be of a similar height as chromic layer 202. Chromic layer 206 serves the purpose of performing DC bias polarization sensitivity which allows switch 100 to be switched ON and OFF. When switch 100 is ON, microstrip line 110 is short circuited and no signal is transmitted. In the absence of chromic layer 206, switch 100 would be able to be switched ON, however, it may not be capable of being switched OFF, since, regardless of the polarization of the DC bias supply, ions from electrolyte region 106 would flow into chromic layer 202 unimpeded. In the case of positive DC bias supply, ions would flow into the chromic layer 202 from the top electrode (microstrip line 110) and in the case of a negative DC bias voltage, the ions would flow into chromic layer 202 from the bottom electrode (ground plane 102).

In an embodiment, the thickness of electrolyte region 106 may be equal to the sum of the chromic layers 202 and 206 and optional conductive layer 204 while providing a surface area large enough to contain enough ions needed to induce a dielectric-conductor transition of chromic layers 202 and 206.

Further adjustments of the switching characteristics of EC switch 100 including the dynamic range, for example, may also be adjusted. The dynamic range of a switch is understood as the ratio between it's ON and OFF states. To determine dynamic range, insertion loss is measured while the switch is in the OFF state. Ideally, this is as low as possible; however, it is influenced by the dielectric parameters of the entire substrate of the switch. Next, the insertion loss once the switch is turned ON is measured. Ideally, the insertion loss should be as high as possible. The difference between the two insertion losses is the dynamic range. The dynamic range of ED switch 100 may be adjusted by changing the thicknesses of the chromic layers and the sandwiched conductor, if present. In addition, power handling may be determined by the overall thickness of EC region 104. In an embodiment, when EC region 104 is thicker it may handle higher power signals due to reduced energy density in the substrate. As with the dynamic range, power handling also can be adjusted by varying the thicknesses of the EC layers and the sandwiched conductor, if present.

The parameters indicated above are by no means exhaustive, since other parameters, such as frequency of operation, may be similarly adjusted. For example, for devices operating at lower frequencies, an embodiment of the EC switch may have a thicker EC region 104, due to unwanted stray capacitances. In an alternative embodiment, devices operating at higher frequencies would use a thinner EC region 104 for the EC switch. The thicknesses of all devices operating at RF frequencies, including μ-wave and mm-wave frequencies, are measured in terms of their corresponding wavelength, thus ensuring that they have the same "electrical" thickness. However, RF devices may also be measured in standard measurement units such as millimeters or inches. At low frequencies, wavelengths are big, indicating that such devices are, from the standard point of view, thicker. Thus, different embodiments can be provided without affecting other parameters by changing height of conductive layer 204.

Another parameter which may be adjusted is the speed of the EC switch. This parameter is dependent on the number of available Li ions i.e., the size of electrolyte region 106 and the height of chromic layers 202 and 206. In general, the lower the height of chromic layers 202 and 206 and the greater the tank of LI ions, the greater is the speed of the EC switch.

Figure 3:
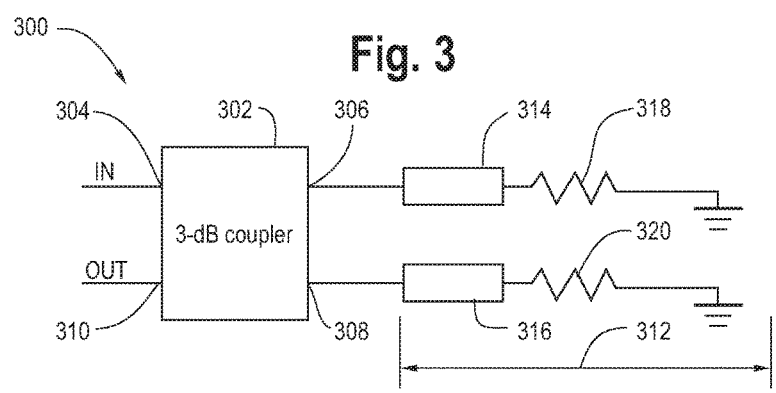
FIG. 3 shows an example of a variable attenuator incorporating the EC switch of FIG. 1.

An embodiment of a device incorporating an EC switch is shown in FIG. 3, which depicts a variable attenuator 300, in particular, a reflection-type attenuator. A 3-dB coupler 302 is a device that splits an input signal into two equal power components, but with a 90° phase difference. A 3 dB coupler may also be known as a hybrid coupler or a quadrature coupler, for example. Coupler 302 has four ports, 304, 306, 308 and 310. For use in an attenuator, coupler 302 receives an input signal at the IN port 304 and provides an output signal to the OUT port 310.

A bias circuit 312 is coupled to ports 306 and 308. Bias circuit 312 includes continuous DC bias controlled EC switches 314 and 316 coupled to ports 306 and 308 respectively. EC switches 314 and 316 are coupled to ground through termination resistors 318 and 320 respectively. In an embodiment, resistors 318 and 320 are approximately 50 ohms, although any value matching the overall system impedance may be used. Port 306 is coupled to one end of a microstrip line 110 (FIG. 1) of switch 314 while resistor 318 is coupled to its opposite end. Likewise, port 308 is coupled to one end of a microstrip line 110 of switch 316 while resistor 320 is coupled to its opposite end.

The operation of attenuator 300 of FIG. 3 is as follows:

1. When there is no DC bias voltage on switches 314 and 316, they are in an OFF state and thus attenuator 300 is in the OFF state, since switches 304 are active components and no DC bias on the switches means that they present an open circuit. All or most of the RF power impinging on active components from the IN port 304 through coupler 302 is reflected towards the OUT port 310 depending on losses in the various components.

2. When there is sufficient DC bias voltage on switches 314 and 316, they are in an ON state and thus attenuator 300 is in the ON state. As explained above, applying a DC bias voltage to switches 314 and 316 causes microstrip line 110 (FIG. 1) in each switch to be short-circuited to ground. All RF power impinging on switches 314 and 316 is now dissipated on termination resistors 318 and 320 so that no RF power reaches OUT port 310.

3. When there is not sufficient DC bias voltage to fully activate switches 314 and 316, attenuator 300 is in an INTERMEDIATE state. One part of the RF power coming into IN port 304 is now consumed by termination resistors 318 and 320 and the parasitic resistance of switches 314 and 316, while the rest is reflected towards OUT port 310. In an embodiment, switches 314 and 316 may be controlled separately or as a pair. In a further embodiment, a single electrolyte region may be shared by both switches, but in this embodiment, both switches would be turned ON/Off at the same time.

Figure 4:
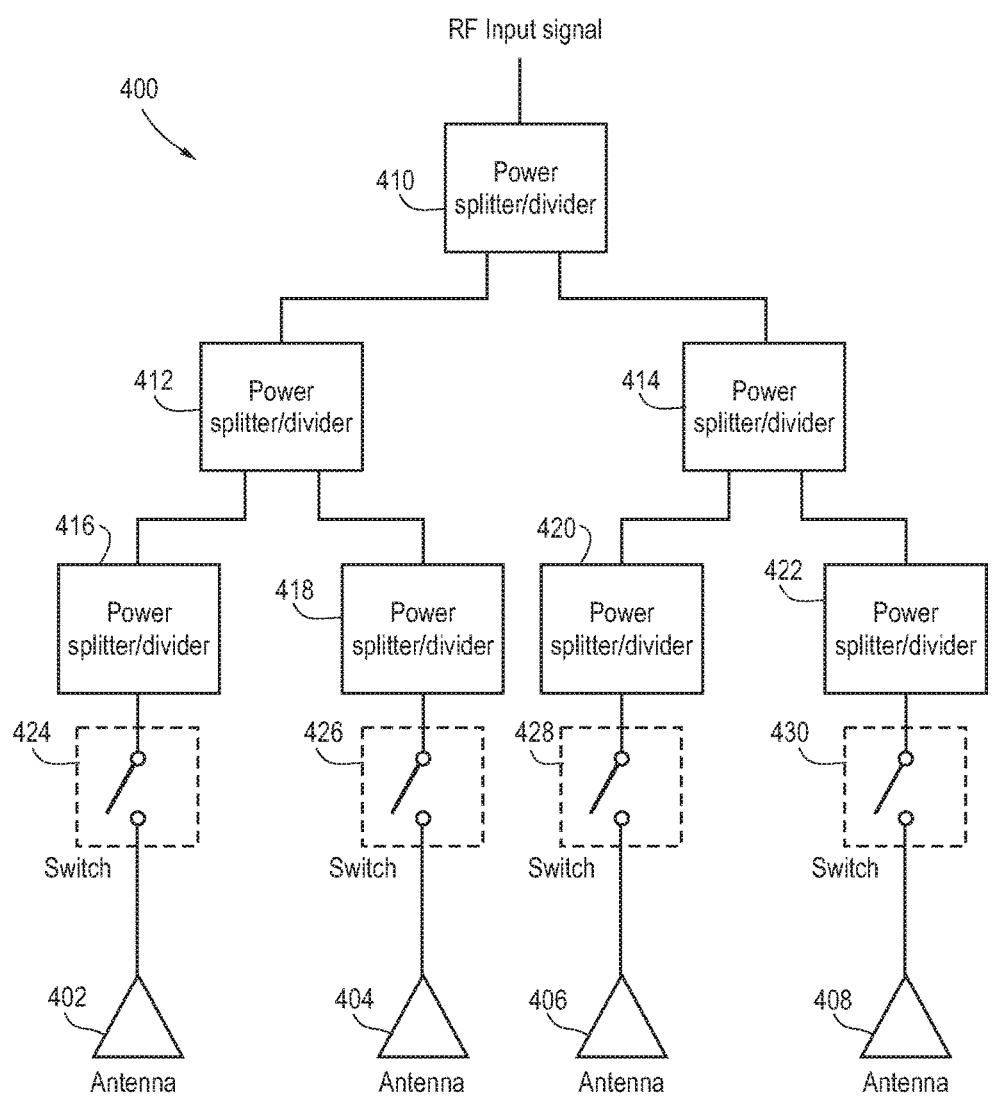
FIG. 4 shows an example of an antenna array architecture incorporating the EC switch of FIG. 1.

Another example embodiment of a device incorporating one or more EC switches is shown in FIG. 4. A representative antenna array architecture 400 includes four antennas 402, 404, 406 and 408. The number and type of antennas may vary, depending on the application of the system. A feed network for antennas 402, 404, 406 and 408 includes power splitter/divider 410 which receives an input RF signal. This input signal is split and sent to power splitter/dividers 412 and 414. The input signal is further split between power splitter/dividers 416, 418, 420 and 422. From this set of power/splitters, the signal goes to EC switches 424, 426, 428 and 430 which are connected to the antenna feed line of antennas 402, 404, 406 and 408, respectively. This architecture uses EC switches 424, 426, 428 and 430 to switch each antenna ON or OFF by the application of DC bias as explained above. Although the antenna array architecture of FIG. 4 is shown with a feed network of power splitter/dividers, any type of directional couplers or other devices to divide an RF signal between multiple outputs could be used.

Figure 5:
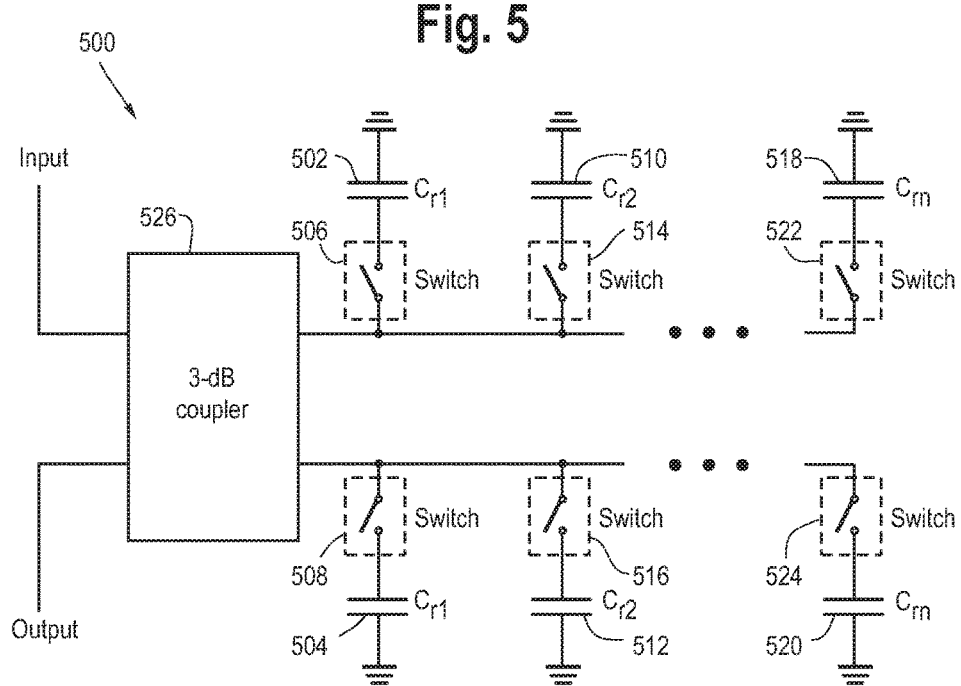
FIG. 5 shows an example of a reflection-type phase shifter (RTPS) incorporating the EC switch of FIG. 1.

A further example embodiment of a device which uses incorporates one or more EC switches is shown in FIG. 5, which depicts a includes a reflection-type phase shifter (RTPS) 500. FIG. 5 depicts a variable RTPS with switches and capacitors, where a particular phase state can be chosen by the actuation of the appropriate switches or a combination of the switches in both branches. A reflection type phase shifter is a symmetrical device, meaning that the switches needed to be switched on or off in pairs in both branches on the right hand-side of FIG. 5. Pairs of capacitors are shown as $C_{r1}$ including capacitors 502 and 504, $C_{r2}$ including capacitors 510 and 512 up to $C_m$ including capacitors 518 and 520. The number of capacitor pairs is dependent on the particular application of the device.

The reflection type phase shifter 500 operates by selecting an appropriate set of capacitors needed to provide a desired level of phase shift by coupler 526. This is done by actuating the appropriate switches. For example, if the desired phase shift is $\Delta\Phi_1$ and this phase shift can be achieved by using the capacitor set of $C_{r1}$, indicated as 502 and 504, then switches 506 and 508 in that branch are activated (switched on), while others are left in the non-actuated state (switched off). If, in another instance, a phase shift of $\Delta\Phi_2$ is required and this cannot be achieved using a single capacitor set, it may be possible to achieve such desired level of phase shift using a combination of capacitor sets, such as $C_{r1}$, indicated as 502 and 504, as well as $C_{r2}$, indicated as 510 and 512 coupled to switches 514 and 518, respectively. In this case, switches 506, 508, 514 and 518 corresponding to these capacitor sets are actuated (switched on) while the others are left non-actuated (switched off).

Figure 6:
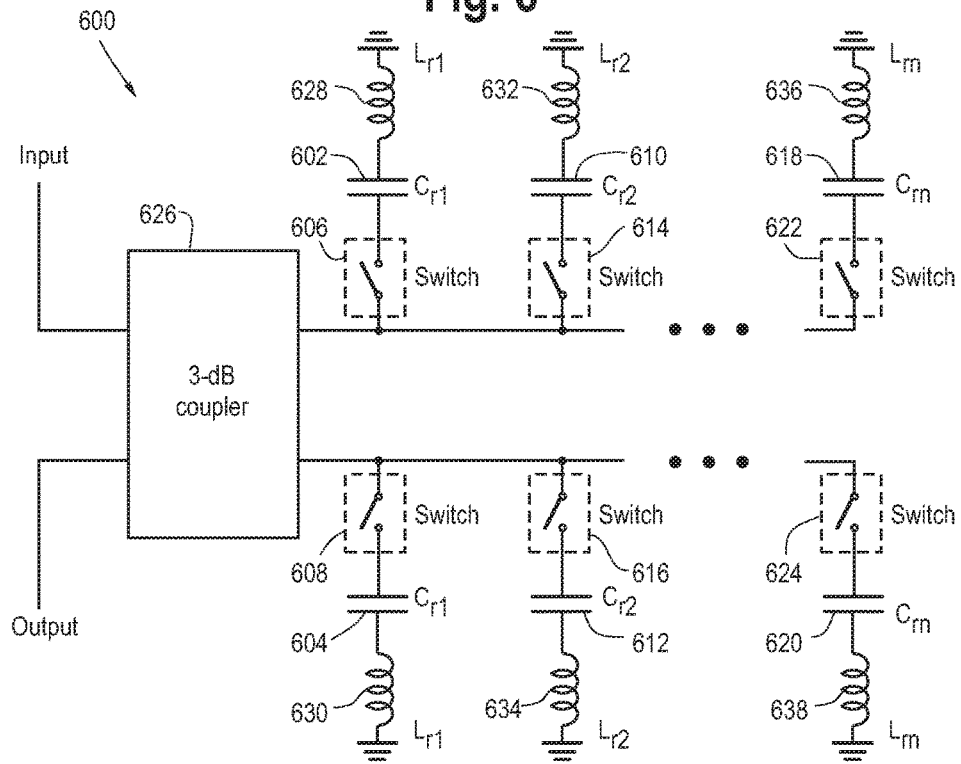
FIG. 6 shows another example of an RTPS incorporating the EC switch of FIG. 1.

In other applications, it may be desirable to have, instead of simple capacitors, $C_{r1} \ldots C_m$, as shown in FIG. 5, either a parallel or series connection of capacitors ($C_{r1} \ldots C_m$) and inductors ($L_{r1} \ldots L_m$) as shown at 600 in FIG. 6. Similarly to FIG. 5, switches 606, 608, 614, 616, 622 and 624 connect capacitors 602, 604, 610, 612, 618 and 620 respectively to 3-dB coupler 626. A scenario with series connection of capacitors and inductors 628, 620, 632, 634, 636 and 638 is depicted in FIG. 6. A parallel connection would have each capacitor and inductor coupled in parallel to the corresponding switch. This configuration will narrow-down the range of operational frequencies, but it will increase the amount of achievable phase shift.

In both FIGS. 5 and 6, although a 3 dB coupler is shown, the devices in these figures may be realized in many different forms, including, for example, hybrid or quadrature couplers.

If used and unless otherwise stated, the terms "upper," "lower," "front," "back," "over," "under," and similar such terms are not to be construed as limiting embodiments to a particular orientation. Instead, these terms are used only on a relative basis.

What is claimed is:

1. A switch comprising:
   an electrochromic region conductively coupled to a microstrip line;
   a voltage-controlled ion source conductively coupled to the microstrip line; and
   a spacer between the electrochromic region and the voltage controlled ion source.

2. A switch, comprising:
   a ground plane layer;
   an electrochromic region adjacent to the ground plane layer;
   an electrolyte region adjacent to the ground plane layer;
   a voltage inactive region adjacent to the ground plane layer and between the electrochromic region and the electrolyte region;
   a microstrip line adjacent to the electrochromic region; and
   a voltage-controlled bias line coupling the microstrip line to the electrolyte region wherein applying a voltage to the bias line causes the microstrip line to be short circuited to the ground plane.

3. The switch of claim 2, wherein the electrochromic region further comprises a first chromic layer and a second chromic layer.

4. The switch of claim 3, wherein the electrochromic region further comprises a conductive layer between the first and second chromic layers.

5. The switch of claim 3, wherein the first and second chromic layers are transition metal oxides.

6. The switch of claim 5 wherein the first chromic layer is tungsten oxide ($WO_3$).

7. The switch of claim 5 wherein the second chromic layer is nickel oxide (NiO).

8. The switch of claim 2 wherein the electrolyte region is lithium niobate ($LiNbO_3$).

9. The switch of claim 2 further comprising a voltage inactive substrate between the voltage-controlled bias line and at least a portion of the electrochromic region.

10. The switch of claim 9 wherein the voltage inactive region and the voltage inactive substrate are silicon dioxide ($SiO_2$).

11. The switch according to claim 2 further comprising a conductive pad adjacent to and the electrolyte region, wherein the switch is controlled by a first voltage applied between the ground plane layer and the conductive pad and a second voltage applied between the conductive pad and the voltage-controlled bias line.

12. The switch according to claim 11, wherein the first and second voltages are less than approximately 10 V.

13. A radio frequency (RF) device comprising at least one switch for switching an RF signal, said at least one switch further comprising:
   a ground plane layer;
   an electrochromic region adjacent to the ground plane layer;
   an electrolyte region adjacent to the ground plane layer;
   a voltage inactive region adjacent to the ground plane layer and between the electrochromic region and the electrolyte region;
   a microstrip line adjacent to the electrochromic region; and
   a voltage-controlled bias line coupling the microstrip line to the electrolyte region wherein applying a voltage to the bias line causes the microstrip line to be short circuited to the ground plane.

14. The RF device of claim 13 wherein the RF device comprises a phase shifter.

15. The RF device of claim 13 wherein the RF device comprises an antenna array.

16. The RF device of claim 13 wherein the RF device comprises an attenuator.

* * * * *